US008258560B1

(12) United States Patent
Hynecek

(10) Patent No.: US 8,258,560 B1
(45) Date of Patent: Sep. 4, 2012

(54) IMAGE SENSORS WITH STACKED PHOTO-DIODES

(75) Inventor: Jaroslav Hynecek, Allen, TX (US)

(73) Assignee: Aptina Imaging Corporation, George Town (KY)

( * ) Notice: Subject to any disclaimer, the term of this patent is extended or adjusted under 35 U.S.C. 154(b) by 0 days.

(21) Appl. No.: 13/027,898

(22) Filed: Feb. 15, 2011

(51) Int. Cl.
*H01L 31/113* (2006.01)

(52) U.S. Cl. ........ 257/292; 257/293; 257/294; 257/432; 257/E27.132

(58) Field of Classification Search .......... 257/292–294, 257/432, 440; 438/48–52
See application file for complete search history.

(56) References Cited

U.S. PATENT DOCUMENTS 3,971,065 A 7/1976 Bayer
5,991,184 A 11/1999 Russell et al.
6,894,265 B2 5/2005 Merrill et al.
2007/0023801 A1 2/2007 Hynecek
2007/0218578 A1* 9/2007 Lee et al. ........................ 438/48
2007/0218613 A1* 9/2007 Lee et al. ...................... 438/197

OTHER PUBLICATIONS

Kasano, “A 2.0 um Pixel Pitch MOS Sensor with an Amorphous Si Film Color Filter.” Digest of Technical Papers ISCC, vol. 48, pp. 348-349, Feb. 2005.
Hynecek, U.S. Appl. No. 12/758,995, filed Apr. 13, 2010.

* cited by examiner

*Primary Examiner* — Dung A. Le
(74) *Attorney, Agent, or Firm* — Treyz Law Group; Nancy Y. Ru; G. Victor Treyz

(57) ABSTRACT

This describes color filter arrangements for image sensor arrays that are formed using image sensor pixels with stacked photo-diodes. The stacked photo-diodes may include first and second photo-diodes and may have the ability to separate color signal according to the depth of carrier generation in a silicon substrate. A single color filter may be formed over the stacked photo-diodes to provide full red-green-blue sensing capability. Charge drain regions may also be formed at different depths in the silicon substrate. If the charge drain regions are formed beneath the stacked photo-diodes in the substrate, full red-green-blue color sensing may be achieved without the use of color filters.

11 Claims, 5 Drawing Sheets

IMAGE SENSORS WITH STACKED PHOTO-DIODES

BACKGROUND

Typical complementary metal-oxide-semiconductor (CMOS) image sensors sense light by converting impinging photons into electrons that are integrated (collected) in sensor pixels. Once the integration cycle is complete, collected charge is converted into a voltage signal, which is supplied to output terminals of an image sensor. This charge to voltage conversion is performed within each sensor pixel. The pixel output voltage (i.e., an analog voltage signal) is transferred to the output terminals using various pixel addressing and scanning schemes. The analog voltage signal can also be converted on-chip to a digital equivalent before reaching the chip output.

The sensor pixels include buffer amplifiers (i.e., source followers) that drive sensing lines connected to the pixels through address transistors. After the charge to voltage conversion and after the resulting voltage signal has been read out from the pixels, the pixels are reset in preparation for a successive charge accumulation cycle. In pixels that include floating diffusions (FD) serving as charge detection nodes, the reset operation is performed by turning on a reset transistor that connects the floating diffusion node to a voltage reference.

Removing charge from the floating diffusion node using the reset transistor, however, generates kTC-reset noise as is well known in the art. The kTC noise must be removed using correlated double sampling (CDS) signal processing technique in order to achieve desired low noise performance. Typical CMOS image sensors that utilize CDS typically require four transistors (4T) per pixel. An example of the 4T pixel circuit with a pinned photo-diode can be found in Guidash (U.S. Pat. No. 5,991,184), incorporated herein as a reference.

Color sensing in typical single-chip CMOS and charge-coupled device (CCD) image sensors is accomplished by placing light-absorbing/color-transmitting filters over the sensor pixels in a predetermined pattern. The different pixels in a given pixel sub-group or sub-array is therefore sensitive to a certain wavelength band of the electromagnetic spectrum. Signals gathered using the different pixel subgroups that have different color sensitivity are then used to construct super-pixel signals using various interpolating and signal processing schemes in an attempt to recover the resolution that has been lost as a result of using color filters.

Examples of conventional color filter array patterns are found in Bayer (U.S. Pat. No. 3,971,065) and Kasano ("A 2.0 um Pixel Pitch MOS Image Sensor with an Amorphous Si Film Color Filter," Digest of Technical Papers ISCC, vol. 48, February 2005, pp. 348349), incorporated herein as references. The color filtering schemes as described in Bayer and Kasano may undesirably sacrifice resolution and sensitivity as a result of light absorption when color filters are used.

In an effort to counteract this reduction in resolution and sensitivity, stacked image sensor pixels that have three photo-diodes placed above each other have been developed by Foveon (see, Merrill U.S. Pat. No. 6,894,265, incorporated herein as a reference). No color filter is placed over the image pixels of Merrill. The three photo-diodes are formed in a silicon substrate at different depths. Impinging photons entering the image sensor may generate carriers in the silicon substrate. The generated carriers are collected at the different depths by the corresponding photo-diodes. A voltage signal is then obtained by connecting the three buried photo-diodes (i.e., the photo-diodes are "buried" in the substrate) to circuitry formed over the surface of the silicon substrate. The voltage signal is sensed, processed, and reset using conventional image pixel readout/reset operations.

Forming image sensors using this approach provides improved resolution and sensitivity because no color filters are used (i.e., no photons are absorbed in the color filters). It may, however, be difficult and costly to form three photo-diodes that are buried deeply in the silicon substrate. It may also be challenging to sense charge collected by all three buried photo-diodes without adding noise.

It would therefore be desirable to be able to provide image sensors that exhibit an improved resolution, sensitivity, and noise.

DETAILED DESCRIPTION

Figure 1:
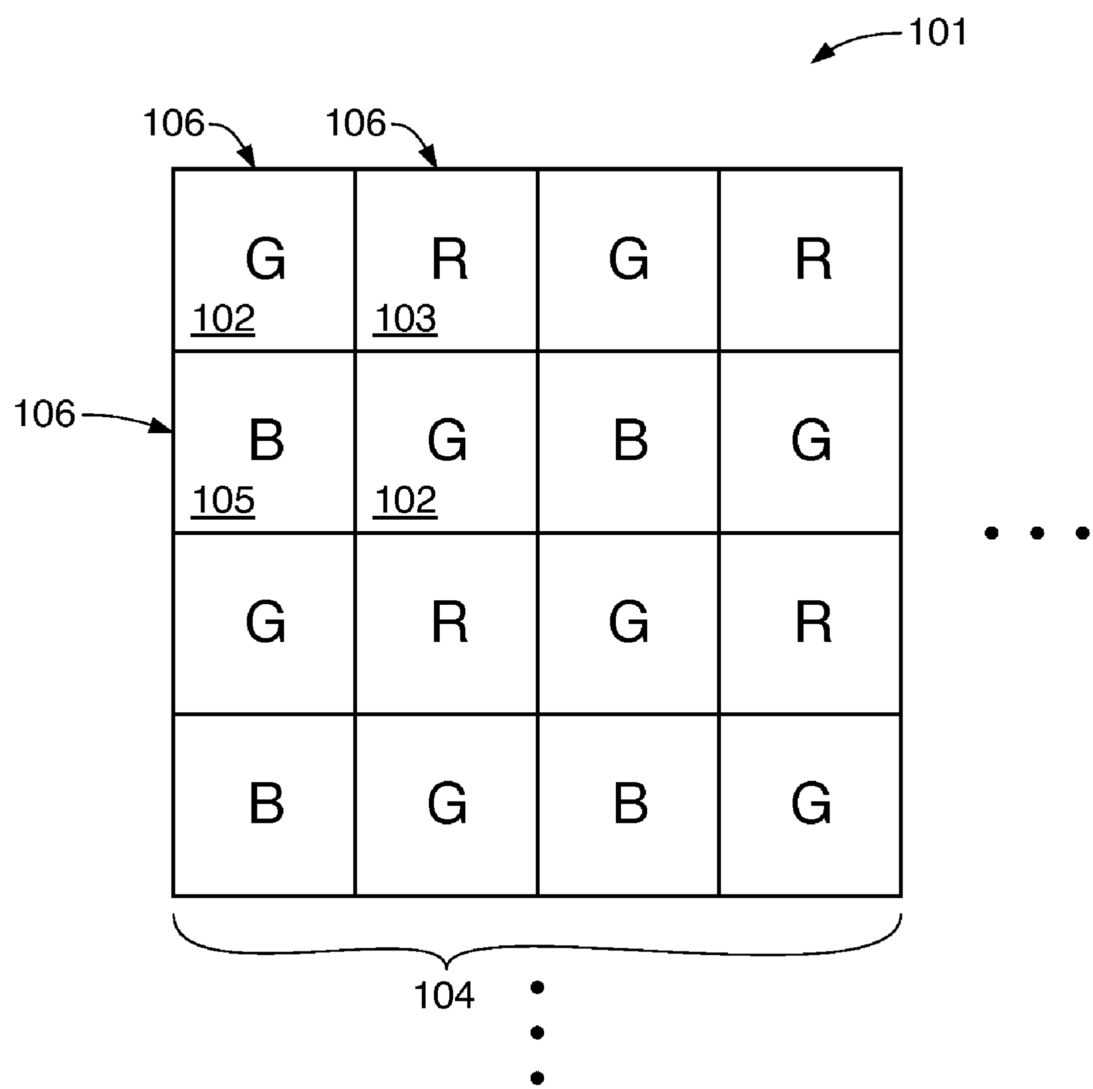
FIG. 1 is a diagram of a conventional Bayer color filter arrangement.

FIG. 1 represents a conventional filter arrangement often referred to as the Bayer color filter array (CFA). As shown in FIG. 1, pixel array 101 consists of individual pixels 106 arranged in a regular grid pattern. The pattern of four by four pixels forms sub-array 104 that is repeated throughout a larger array that can contain millions of individual pixels. Sub-array 104 includes eight green filters 102, four blue filters 105, and four red filters 103 formed over pixels 106. Filters 102, 105, and 103 are formed from an organic material that is saturated by a suitable dye that absorbs and transmits light having a selected wavelength band. Micro-lenses are typically formed on top of the color filters to help focus light towards a desired region in each image sensor pixel 106 (i.e., to direct the incoming light away from the insensitive regions such as wires and transistors).

While the Bayer filter arrangement is functional, it may, however, exhibit several drawbacks. For example, filters 102, 105, and 103 absorb a large portion of the light spectrum so that only the wavelength associated with the desired color is passed through. Absorbing the large portion of incoming light in this way may significantly reduce image sensor sensitivity.

The 4×4 sub-array 104 also reduces resolution and produces a Moiré effect in the captured image. The Moiré effect is wavy pattern that can manifest itself when a captured image contains areas with repetitive detail that exceeds the resolution of the image sensor. The missing color information (i.e., portions of the incoming light that have been absorbed by the filters) must be recovered using a suitable interpolation technique, which further reduces image resolution and increases noise. Moreover, the color filters must have a certain minimum thickness in order to properly absorb light from the undesired wavelength bands. This thickness requirement makes it harder for the micro-lenses to properly focus light on the sensitive regions in pixels 106.

It may therefore be desirable to use different color filter arrays and pixels that are formed using stacked photo-diodes (e.g., photo-diodes that have potential energy wells formed at different depths within a semiconductor substrate). The use of stacked photo-diodes enables the detection of carriers (e.g., electrons) generated at different depths in a silicon substrate.

Incoming light that penetrates the silicon substrate of the image sensor may include various wavelength bands, each of which generates electrons at the different depths. Because the electrons generated a the different depths can be temporarily stored in separate potential energy wells, it is therefore possible for pixels with stacked photo-diodes to separate the color signal within the silicon substrate into multiple color bands, thereby reducing the number (or thickness) of color filters that must be formed over the image sensor pixels.

Figure 2A:
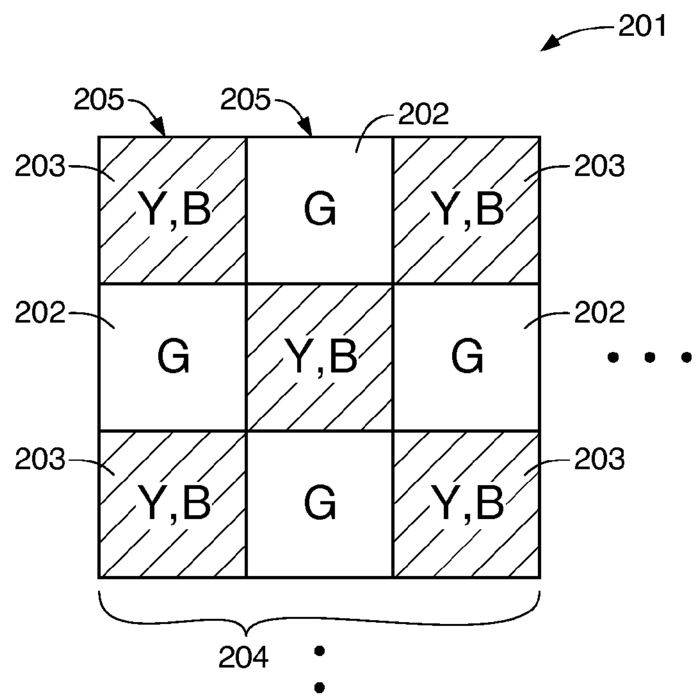
FIG. 2A is a diagram of an illustrative green-clear-green-clear color filter arrangement that is used for image sensor arrays having pixels with stacked photo-diodes in accordance with an embodiment of the present invention.

FIG. 2A shows one suitable filter layout arrangement for pixels that are formed using stacked photo-diodes. A stacked photo-diode may include a buried bottom photo-diode formed below a top photo-diode. The top photo-diode and the buried photo-diode may be separated by a p+ energy barrier (as an example). The top photo-diode may be capable of collecting charge generated from mostly blue light, whereas the bottom photo-diode may be capable of collecting charge generated from green light and/or red light (e.g., the bottom photo-diode may be capable of collecting charge generated from green light, red light, yellow light, etc.).

As shown in FIG. 2A, pixel array 201 may include individual pixels 205 that are organized into 3×3 sub-arrays 204. Green filters may be formed over pixels 202, whereas no filter may be formed over pixels 203 (e.g., clear filters may be formed over pixels 203). The 3×3 sub-array 204 may include four green filters and five clear filters (e.g., filters that pass through yellow and blue light) arranged in a checkerboard pattern. Pixels 203 may be capable of sensing blue and yellow light because pixels 203 are formed using stacked photo-diodes. For example, pixel 203 may include a top photo-diode configured to detect predominantly blue light and a bottom photo-diode configured to detect yellow light. Pixels 202 may be formed using non-stacked photo-diodes to detect green light or cyan (sometimes referred to as blue-green) light. If desired, pixels 202 may also be formed using stacked photo-diodes to increase dynamic range, to reduce pixel crosstalk, etc.

Figure 2B:
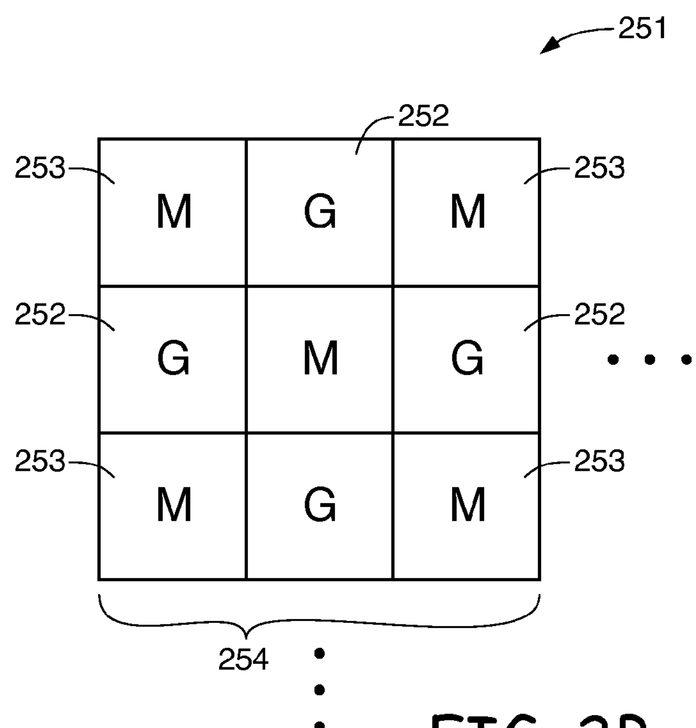
FIG. 2B is a diagram of an illustrative green-magenta-green-magenta color filter arrangement that is used for image sensor arrays in accordance with an embodiment of the present invention.

Another suitable color filter arrangement is shown in FIG. 2B. As shown in FIG. 2B, pixel array 251 is grouped into 3×3 sub-arrays 254. Sub-array 254 may include four green pixels 252 and five magenta pixels 253 arranged in a checkerboard pattern. A green filter may be formed over each green pixel 252, whereas a magenta filter may be formed over each magenta pixel 253. The green pixels may be formed using non-stacked photo-diodes, whereas the magenta pixels may be formed using non-stacked or stacked photo-diodes. As a result image sensor arrays that use magenta filters may exhibit higher light sensitivity relative to those with red filters.

Figure 3:
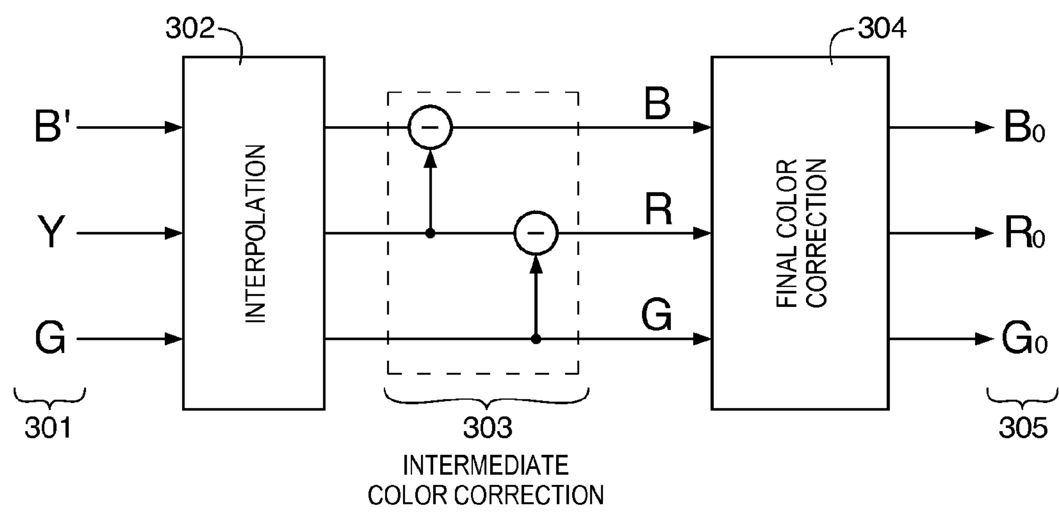
FIG. 3 is a diagram of an illustrative color signal processing scheme that can be used in conjunction with the color filter arrangement of FIG. 2 in accordance with an embodiment of the present invention.

FIG. 3 shows a simplified schematic diagram illustrating steps involved in a signal processing scheme that can be used to process signals generated by pixel array 201 of FIG. 2A. As shown in FIG. 3, pixel signals 301 (e.g., signals that include blue signal B' gathered using the top photo-diode in pixel 203, yellow signal Y gathered using the bottom photo-diode in pixel 203, and green signal G gathered using the bottom photo-diode in pixel 202) are first processed using signal interpolation circuit 302. Circuit 302 replaces missing pixel color by interpolating signals from neighboring pixels. This interpolation step may be necessary, because the 3×3 pixel matrix has reduced resolution similar to the 4×4 Bayer pixel array.

Interpolated signals B', Y, and G may be fed to circuit 303 for color adjustments. During color adjustment operations, circuit 303 may subtract a small portion of yellow signal Y from blue signal B' to compensate for the fact that yellow signal Y also passes through the top photo-diode where blue signal B' is generated, thereby producing adjusted blue signal B. Red signal R may be obtained by subtracting green signal G from yellow signal Y. Circuit 303 does not adjust green signal G. No pre-processing is performed on signal G, which may be desirable because the green signal is the dominant signal used for constructing luminance.

Signals B, R, and G are then fed to final color correction circuit 304. Final color correction circuit 304 may generate final RGB colors 305 (including signals $B_o$, $R_o$, and $G_o$). If desired, other color processing and color correction schemes that are suitable for use with stacked photo-diodes and that are well known in the art may also be implemented.

Figure 4:
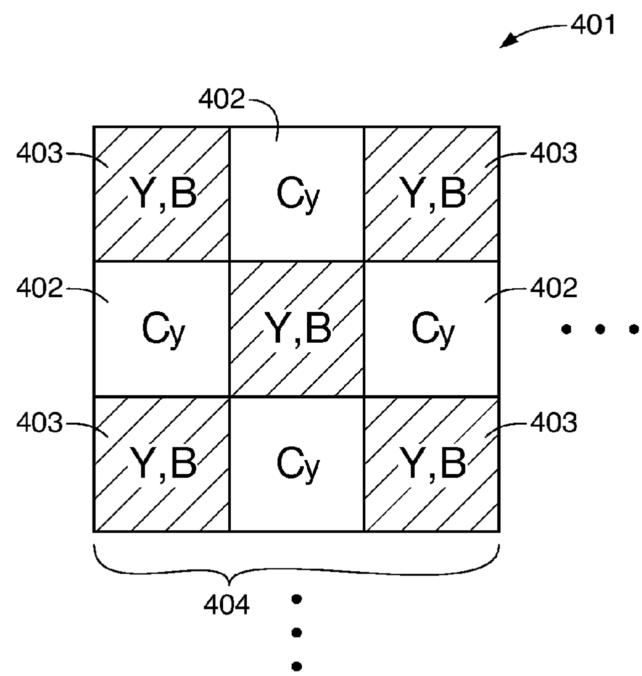
FIG. 4 is a diagram of an illustrative cyan-clear-cyan-clear color filter arrangement that is used for image sensor arrays having pixels with stacked and non-stacked photo-diodes in accordance with an embodiment of the present invention.

Another suitable color filter arrangement for pixels with stacked photo-diodes is shown in FIG. 4. As shown in FIG. 4, pixel array 401 is grouped into 3×3 sub-arrays 404. Sub-array 404 may include four cyan pixels 402 and five yellow-blue pixels 403 arranged in a checkerboard pattern. A cyan filter may be formed over each cyan pixel 402, whereas a clear filter may be formed over each yellow-blue pixel 403. The yellow-blue pixels may be formed using stacked photodiodes, whereas the cyan pixels may be formed using non-stacked photo-diodes. In general, cyan filters absorb less light in comparison to green filters. As a result, image sensor arrays that use cyan filters may exhibit higher light sensitivity relative to those with green filters.

The blue signal gathered using this type of image sensor has full sensor resolution, because every pixel may be used to deliver an independent blue signal. For example, the top photo-diode of pixels 402 may deliver a first set of blue signals, whereas the top photo-diode of pixels 403 may deliver a second set of blue signals. As a result, no interpolation is necessary. This feature may be helpful in minimizing the Moiré effect and in increasing the overall sensor resolution.

Figure 5:
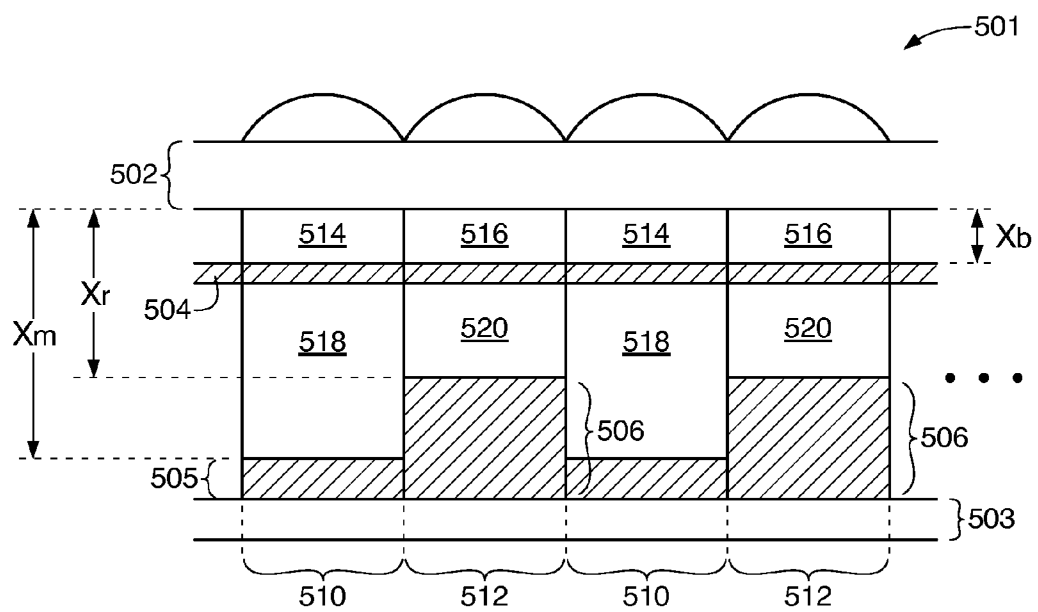
FIG. 5 is a simplified cross-sectional diagram of an image sensor array having charge drains at different depths in accordance with an embodiment of the present invention.

FIG. 5 is a simplified cross-sectional diagram for image sensor array 501 having pixels formed with stacked photo-diodes. As shown in FIG. 5, array 501 may include barrier 504 (e.g., a p+ doped region) formed at a depth Xb in the silicon substrate. Barrier 504 may serve to provide color separation between the blue and yellow (green and red) signals. For example, charge signals generated above barrier 504 is sensed separately from charge signals generated below barrier 504.

Array 501 may, for example, include yellow-blue pixels 510 and blue-green pixels 512 arranged in an alternating checkerboard pattern (see, e.g., FIG. 5). Yellow-blue pixel 510 may include charge drain region 505 formed at a depth Xm, whereas blue-green pixel 512 may include charge drain region 506 formed at a depth Xr. Charge drain regions 505 and 506 may include n+ doped regions that drain away (remove) carriers generated at their respective depths. Pixel 510 may include a top photo-diode (e.g., a first photodiode formed using a first p-type doped region and a first n-type doped region) formed in region 514 and a buried photo-diode (e.g., a second photodiode formed using a second p-type doped region and a second n-type doped region, where the first photodiode is stacked vertically above the second photo-diode) formed in region 518. Pixel 512 may include a top photo-diode formed in region 516 and a buried photo-diode formed in region 520. Charge (e.g., carriers such as electrons) generated in the regions below Xm and Xr are not collected in the top nor bottom photo-diodes. Instead, the charge is drained away from the pixels. If desired, charge drain region 505 need not be formed for pixel 510, because any charge generated below Xm can be collect by region 518 without affecting colors in the visible spectrum.

Sensor array 501 may also include passivation oxide layer 502 (or other suitable material) deposited over pixels 510 and 512. An array of micro-lenses may be formed over layer 502. No color filters are deposited on top of sensor array 501, thereby reducing the height of the image sensor (e.g., sensor array 501 lacks a color filter array so that image light is received by the photo-diodes in pixels 510 and 512 without passing through any intervening color filter array element). As a result, the sensitivity and focusing performance of the micro-lenses are significantly improved over arrays that use color filters.

The arrangement of sensor array 501 in FIG. 5 is merely illustrative. As shown in FIG. 5, sensory array 501 receives light from an upper surface of the semiconductor substrate in which the stacked photo-diodes are formed. This type of sensor illumination technique is commonly known as front-side-illumination. If desired, sensory array 501 may be illuminated from the lower (back) surface of the semiconductor substrate (e.g., using back-side-illumination). If the back-side-illumination arrangement is implemented, distances Xr, Xm, and Xb will be measured from the lower surface of the substrate. For example, regions 514 and 516 will be closer to the lower surface compared to regions 518 and 520, respectively, and charge drain regions 505 and 506 will be even further away from the lower surface compared to regions 518 and 520, respectively.

Figure 6:
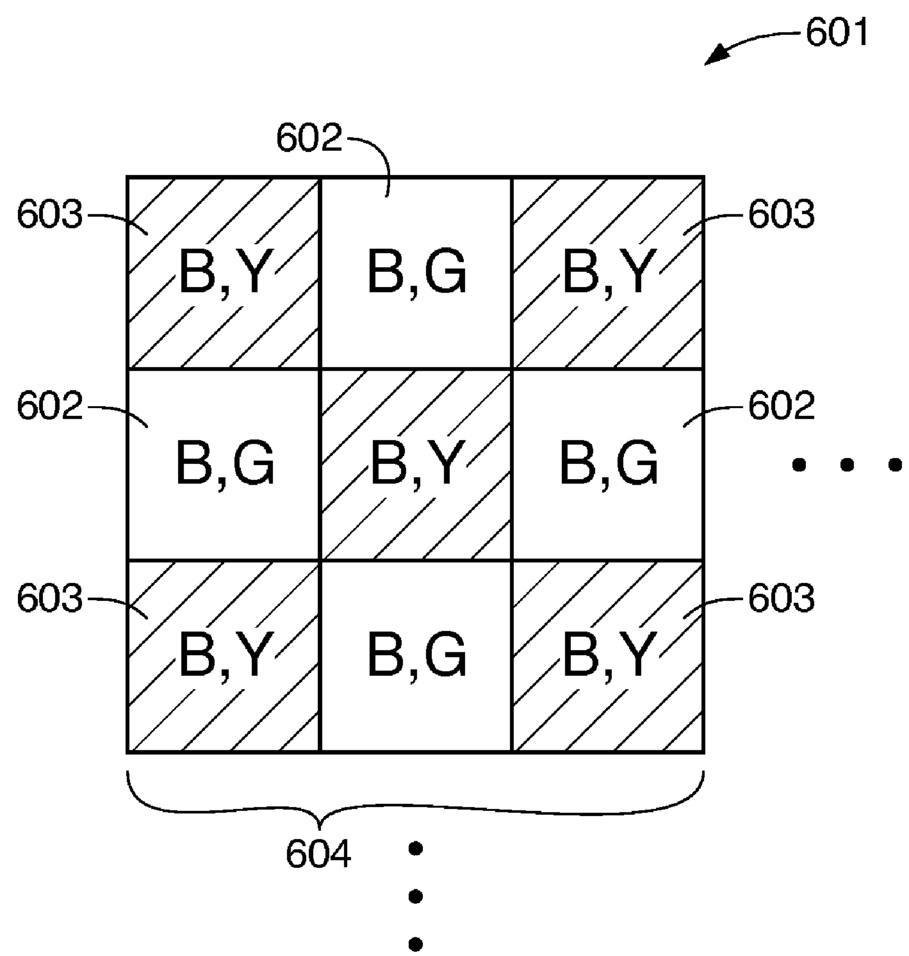
FIG. 6 is a diagram of an illustrate clear-blue/green-clear-blue/green color filter arrangement that is used for image sensor arrays having pixels with stacked photo-diodes in accordance with an embodiment of the present invention.

A pixel arrangement that can be used with the image sensor array described in connection with FIG. 5 is shown in FIG. 6. As shown in FIG. 6, array 601 may include blue-green pixels 602 and blue-yellow pixels 603 arranged in a checkerboard pattern. Blue-green pixels 602 may have charge drains formed at depth Xr, whereas blue-yellow pixels 603 may have charge drains formed at depth Xm. For example, blue-green pixel 602 may include a top photo-diode operable to detect blue light and a bottom photo-diode operable to detect green light, whereas blue-yellow pixel 603 may include a top photo-diode operable to detect blue light and a bottom photo-diode operable to detect yellow light. Sensor array 601 configured in this way exhibits improved sensitivity and resolution because no color filters is needed.

Various embodiments have been described illustrating image sensors that have stacked photo-diodes. The image sensors with stacked photo-diodes may be used in any electronic device.

Image sensors may have pixels that are formed using stacked photo-diodes. The stacked photo-diodes may sense color by vertically separating generated photo-carriers. Each pixel may therefore provide at least one color-coded signal without requiring the use of conventional light absorbing color filters.

In one suitable embodiment, an image sensor array may be formed using green filters and clear filters arranged in a checkerboard pattern. The pixels formed under the green filters may include stacked or non-stacked photo-diodes, whereas the pixels formed under the clear filters may include stacked photo-diodes.

In another suitable embodiment, an image sensor array may be formed using cyan filters and clear filters arranged in a checkerboard pattern. The pixels formed under the green cyan filters may include non-stacked photo-diodes, whereas the pixels formed under the clear filters may include stacked photo-diodes.

In another suitable embodiment, an image sensor array may be formed without any color filter arrays. This image sensor array may include blue-yellow pixels and blue-green pixels. The blue-yellow pixels may each include a charge drain formed at a first depth within a silicon substrate, whereas the blue-green pixels may each include a charge drain formed at a second depth within the silicon substrate. The second depth may be less than the first depth. The charge drains formed at the different depths may serve to drain the charge generated below their respective depths. The blue-yellow pixels and the blue-green pixels may be stacked photo-diodes.

The foregoing is merely illustrative of the principles of this invention which can be practiced in other embodiments.

What is claimed is:

1. An image sensor comprising:

a substrate;

a first plurality of image sensor pixels formed in the substrate; and a second plurality of image sensor pixels formed in the substrate, wherein the first plurality of image sensor pixels each comprise a first charge drain region formed at a first depth within the semiconductor substrate and wherein the first charge drain regions comprise n+ doped regions.

2. The image sensor defined in claim 1, wherein the second plurality of image sensor pixels each comprise a second charge drain region formed at a second depth that is different than the first depth within the semiconductor substrate.

3. The image sensor defined in claim 2, wherein the image sensor lacks a color filter array so that image light is received by the first and second plurality of image sensor pixels without passing through any intervening color filter array element.

4. The image sensor defined in claim 2, wherein the first and second plurality of image sensor pixels comprise stacked photo-diodes.

5. The image sensor defined in claim 2, wherein the second charge drain regions comprise n+ doped regions.

6. The image sensor defined in claim 2, wherein the image sensor comprises a front-side-illuminated image sensor, wherein the substrate comprises a surface in which the first and second plurality of image sensors are formed, and wherein light enters the image sensor through the surface.

7. The image sensor defined in claim 2, wherein the image sensor comprises a back-side-illuminated image sensor, wherein the substrate comprises a top surface in which the first and second plurality of image sensors are formed and a bottom surface, and wherein light enters the image sensor through the bottom surface.

8. The image sensor defined in claim 1, wherein the first and second plurality of image sensor pixels comprise stacked photo-diodes.

9. An image sensor comprising:

a substrate;

a first plurality of image sensor pixels formed in the substrate; and a second plurality of image sensor pixels formed in the substrate, wherein the first plurality of image sensor pixels each comprise a first charge drain region formed at a first depth within the semiconductor substrate, wherein the second plurality of image sensor pixels each comprise a second charge drain region formed at a second depth that is different than the first depth within the semiconductor substrate, wherein the first and second plurality of image sensor pixels comprise stacked photo-diodes, wherein each of the stacked photo-diodes comprises:

a first photo-diode formed using a first p-type doped region and a first n-type doped region; and a second photo-diode formed using a second p-type doped region and a second n-type doped region, wherein the first photodiode is stacked vertically below the second photodiode.

10. An image sensor comprising:

a substrate;

a first plurality of image sensor pixels formed in the substrate; and a second plurality of image sensor pixels formed in the substrate, wherein the first plurality of image sensor pixels each comprise a first charge drain region formed at a first depth within the semiconductor substrate, wherein the second plurality of image sensor pixels each comprise a second charge drain region formed at a second depth that is different than the first depth within the semiconductor substrate, wherein the first and second plurality of image sensor pixels comprise stacked photo-diodes, wherein each of the stacked photo-diodes comprises:

a first photo-diode formed using a first p-type doped region and a first n-type doped region; and a second photo-diode formed using a second p-type doped region and a second n-type doped region, wherein the first photodiode is stacked vertically below the second photodiode, wherein the first photo-diode collects charge generated by blue light and wherein the second photo-diode collects charge generated by light selected from a group consisting of: green light and yellow light.

11. The image sensor defined in claim 10, wherein each of the stacked photo-diodes further comprises:

a p+ doped potential barrier region formed between the first photo-diode and the second photo-diode.

* * * * *